(12) United States Patent
Liu et al.

(10) Patent No.: US 8,883,604 B2
(45) Date of Patent: Nov. 11, 2014

(54) INTEGRATED CIRCUITRY COMPRISING NONVOLATILE MEMORY CELLS AND METHODS OF FORMING A NONVOLATILE MEMORY CELL

(71) Applicant: Micron Technology, Inc., Boise, ID (US)

(72) Inventors: Jun Liu, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/066,805

(22) Filed: Oct. 30, 2013

(65) Prior Publication Data

US 2014/0057406 A1 Feb. 27, 2014

Related U.S. Application Data

(62) Division of application No. 12/909,650, filed on Oct. 21, 2010, now Pat. No. 8,759,809.

(51) Int. Cl.
*H01L 21/20* (2006.01)
*H01L 45/00* (2006.01)
*H01L 27/24* (2006.01)

(52) U.S. Cl.
CPC .......... *H01L 45/1266* (2013.01); *H01L 45/144* (2013.01); *H01L 27/2472* (2013.01); *H01L 45/085* (2013.01); *H01L 27/2481* (2013.01)
USPC .......................... 438/382; 257/4; 257/E45.02

(58) Field of Classification Search
USPC ........................................................ 257/2–5
See application file for complete search history.

(56) References Cited

U.S. PATENT DOCUMENTS

| | | | |
|---|---|---|---|
| 4,715,685 | A | 12/1987 | Yaniv et al. |
| 4,964,080 | A | 10/1990 | Tzeng |
| 5,049,970 | A | 9/1991 | Tanaka et al. |
| 5,122,476 | A | 6/1992 | Fazan et al. |
| 6,524,867 | B2 | 2/2003 | Yang et al. |
| 6,552,952 | B2 | 4/2003 | Pascucci |

(Continued)

FOREIGN PATENT DOCUMENTS

| | | |
|---|---|---|
| CN | 1444284 | 9/2003 |
| CN | 1459792 | 12/2003 |

(Continued)

OTHER PUBLICATIONS

U.S. Appl. No. 12/014,232, filed Jan. 15, 2008, Liu.

(Continued)

*Primary Examiner* — William F Kraig
*Assistant Examiner* — Khaja Ahmad
(74) *Attorney, Agent, or Firm* — Wells St. John, P.S.

(57) ABSTRACT

An integrated circuit has a nonvolatile memory cell that includes a first electrode, a second electrode, and an ion conductive material there-between. At least one of the first and second electrodes has an electrochemically active surface received directly against the ion conductive material. The second electrode is elevationally outward of the first electrode. The first electrode extends laterally in a first direction and the ion conductive material extends in a second direction different from and intersecting the first direction. The first electrode is received directly against the ion conductive material only where the first and second directions intersect. Other embodiments, including method embodiments, are disclosed.

17 Claims, 7 Drawing Sheets

(56) References Cited

U.S. PATENT DOCUMENTS

| | | |
|---|---|---|
| 6,687,147 B2 | 2/2004 | Fricke et al. |
| 6,693,821 B2 | 2/2004 | Hsu et al. |
| 6,693,846 B2 | 2/2004 | Fibranz |
| 6,717,881 B2 | 4/2004 | Ooishi |
| 6,753,561 B1 | 6/2004 | Chevallier et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |
| 6,806,531 B1 | 10/2004 | Chen et al. |
| 6,834,008 B2 | 12/2004 | Rinerson et al. |
| 6,873,544 B2 | 3/2005 | Perner et al. |
| 6,905,937 B2 | 6/2005 | Hsu et al. |
| 6,930,324 B2 | 8/2005 | Kowalski et al. |
| 6,940,113 B2 | 9/2005 | Hsu et al. |
| 6,946,702 B2 | 9/2005 | Jang |
| 6,950,369 B2 | 9/2005 | Kunikiyo et al. |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 6,985,374 B2 | 1/2006 | Yamamura |
| 7,002,197 B2 | 2/2006 | Perner et al. |
| 7,005,350 B2 | 2/2006 | Walker et al. |
| 7,009,278 B2 | 3/2006 | Hsu |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Tripsas et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,109,544 B2 | 9/2006 | Schoelesser et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,465,675 B2 | 12/2008 | Koh |
| 7,473,982 B2 | 1/2009 | Aono et al. |
| 7,489,552 B2 | 2/2009 | Kurotsuchi et al. |
| 7,525,410 B2 | 4/2009 | Aono et al. |
| 7,538,338 B2 | 5/2009 | Rinerson et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,666,526 B2 | 2/2010 | Chen et al. |
| 7,671,417 B2 | 3/2010 | Yoshida et al. |
| 7,679,812 B2 | 3/2010 | Sasagawa et al. |
| 7,687,793 B2 | 3/2010 | Harshfield et al. |
| 7,687,840 B2 | 3/2010 | Shinmura |
| 7,696,077 B2 | 4/2010 | Liu |
| 7,700,935 B2 | 4/2010 | Kim et al. |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 7,838,861 B2 | 11/2010 | Klostermann |
| 7,842,991 B2 | 11/2010 | Cho et al. |
| 7,864,568 B2 | 1/2011 | Fujisaki et al. |
| 7,898,839 B2 | 3/2011 | Aoki |
| 7,907,436 B2 | 3/2011 | Maejima et al. |
| 7,910,909 B2 | 3/2011 | Kim et al. |
| 7,948,784 B2 | 5/2011 | Kajigaya |
| 7,990,754 B2 | 8/2011 | Azuma et al. |
| 8,021,897 B2 | 9/2011 | Sills et al. |
| 8,043,926 B2 | 10/2011 | Cho et al. |
| 8,048,755 B2 | 11/2011 | Sandhu et al. |
| 8,094,477 B2 | 1/2012 | Maejima |
| 8,098,520 B2 | 1/2012 | Seigler et al. |
| 8,106,375 B2 | 1/2012 | Chen et al. |
| 8,124,968 B2 | 2/2012 | Koo et al. |
| 8,154,908 B2 | 4/2012 | Maejima et al. |
| 8,154,909 B2 | 4/2012 | Azuma et al. |
| 8,295,077 B2 | 10/2012 | Murooka |
| 8,411,477 B2 | 4/2013 | Tang et al. |
| 8,536,556 B2 | 9/2013 | Fukumizu |
| 8,537,592 B2 | 9/2013 | Liu |
| 8,542,513 B2 | 9/2013 | Tang et al. |
| 8,611,121 B2 | 12/2013 | Ahn et al. |
| 2002/0018355 A1 | 2/2002 | Johnson et al. |
| 2002/0034117 A1 | 3/2002 | Okazawa |
| 2002/0196695 A1 | 12/2002 | Pascucci |
| 2003/0031047 A1 | 2/2003 | Anthony et al. |
| 2003/0174042 A1 | 9/2003 | Aono et al. |
| 2003/0174570 A1 | 9/2003 | Ooishi |
| 2003/0218902 A1 | 11/2003 | Perner et al. |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0245547 A1 | 12/2004 | Stipe |
| 2005/0001257 A1 | 1/2005 | Schoelesser et al. |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0205943 A1 | 9/2005 | Yamada |
| 2005/0243844 A1 | 11/2005 | Aono et al. |
| 2005/0250281 A1 | 11/2005 | Ufert et al. |
| 2005/0269646 A1 | 12/2005 | Yamada |
| 2005/0287741 A1 | 12/2005 | Ding |
| 2006/0035451 A1 | 2/2006 | Hsu |
| 2006/0048509 A1 | 3/2006 | Gwan-Hyeob |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0215445 A1 | 9/2006 | Baek et al. |
| 2006/0258079 A1 | 11/2006 | Lung et al. |
| 2006/0274593 A1 | 12/2006 | Kurotsuchi et al. |
| 2006/0284242 A1 | 12/2006 | Jo |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0019923 A1 | 1/2007 | Sasagawa et al. |
| 2007/0045615 A1 | 3/2007 | Cho et al. |
| 2007/0048990 A1 | 3/2007 | Zhuang et al. |
| 2007/0086235 A1 | 4/2007 | Kim et al. |
| 2007/0109835 A1 | 5/2007 | Hsu |
| 2007/0120124 A1 | 5/2007 | Chen et al. |
| 2007/0121369 A1 | 5/2007 | Happ |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0173019 A1 | 7/2007 | Ho et al. |
| 2007/0176261 A1* | 8/2007 | Lung .................... 257/536 |
| 2007/0210348 A1 | 9/2007 | Song et al. |
| 2007/0224770 A1 | 9/2007 | Nagashima |

(56) References Cited

U.S. PATENT DOCUMENTS

| | | | |
|---|---|---|---|
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1 | 12/2007 | Toda et al. |
| 2007/0295950 A1 | 12/2007 | Cho et al. |
| 2008/0001172 A1 | 1/2008 | Karg et al. |
| 2008/0008642 A1 | 1/2008 | Mori et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0089105 A1 | 4/2008 | Ro et al. |
| 2008/0093591 A1 | 4/2008 | Khang et al. |
| 2008/0099753 A1 | 5/2008 | Song et al. |
| 2008/0102278 A1 | 5/2008 | Kreupl et al. |
| 2008/0105862 A1* | 5/2008 | Lung et al. ............ 257/4 |
| 2008/0106925 A1 | 5/2008 | Paz de Araujo et al. |
| 2008/0157257 A1 | 7/2008 | Bertin et al. |
| 2008/0175031 A1 | 7/2008 | Park et al. |
| 2008/0175032 A1 | 7/2008 | Tanaka et al. |
| 2008/0185571 A1 | 8/2008 | Happ et al. |
| 2008/0212361 A1 | 9/2008 | Bertin et al. |
| 2008/0232160 A1 | 9/2008 | Gopalakrishnan |
| 2008/0247219 A1 | 10/2008 | Choi et al. |
| 2008/0251779 A1* | 10/2008 | Kakoschke et al. ............ 257/5 |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya et al. |
| 2009/0072217 A1 | 3/2009 | Klostermann |
| 2009/0085121 A1 | 4/2009 | Park et al. |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0207681 A1 | 8/2009 | Juengling |
| 2009/0218557 A1 | 9/2009 | Sato |
| 2009/0250681 A1 | 10/2009 | Smythe et al. |
| 2009/0261314 A1 | 10/2009 | Kim et al. |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0316474 A1 | 12/2009 | Cho et al. |
| 2009/0317540 A1 | 12/2009 | Sandhu et al. |
| 2009/0323385 A1 | 12/2009 | Scheuerlein et al. |
| 2010/0003782 A1 | 1/2010 | Sinha et al. |
| 2010/0008163 A1 | 1/2010 | Liu |
| 2010/0044666 A1 | 2/2010 | Baek et al. |
| 2010/0046273 A1 | 2/2010 | Azuma et al. |
| 2010/0065836 A1 | 3/2010 | Lee et al. |
| 2010/0084741 A1 | 4/2010 | Andres et al. |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157657 A1 | 6/2010 | Rinerson et al. |
| 2010/0157658 A1 | 6/2010 | Schloss et al. |
| 2010/0163820 A1 | 7/2010 | Son |
| 2010/0163829 A1 | 7/2010 | Wang et al. |
| 2010/0178729 A1 | 7/2010 | Yoon et al. |
| 2010/0193758 A1 | 8/2010 | Tian et al. |
| 2010/0193761 A1* | 8/2010 | Amin et al. ............ 257/4 |
| 2010/0193762 A1 | 8/2010 | Hsieh et al. |
| 2010/0195371 A1 | 8/2010 | Ohba et al. |
| 2010/0232200 A1 | 9/2010 | Shepard |
| 2010/0237442 A1 | 9/2010 | Li et al. |
| 2010/0243983 A1 | 9/2010 | Chiang et al. |
| 2010/0258782 A1 | 10/2010 | Kuse et al. |
| 2010/0259962 A1 | 10/2010 | Yan et al. |
| 2011/0059576 A1 | 3/2011 | Cho et al. |
| 2011/0128775 A1 | 6/2011 | Maejima et al. |
| 2011/0171836 A1 | 7/2011 | Xia |
| 2011/0193044 A1 | 8/2011 | Sandhu et al. |
| 2011/0261606 A1 | 10/2011 | Sandhu et al. |
| 2011/0261607 A1 | 10/2011 | Tang et al. |
| 2012/0140542 A1 | 6/2012 | Liu |
| 2012/0164798 A1 | 6/2012 | Sills et al. |
| 2012/0187363 A1 | 7/2012 | Liu et al. |

FOREIGN PATENT DOCUMENTS

| | | |
|---|---|---|
| CN | 1624803 | 6/2005 |
| CN | 101005113 | 12/2006 |
| CN | 101051670 | 4/2007 |
| CN | 101034732 | 9/2007 |
| CN | 200880124714.6 | 7/2012 |
| EP | 1796103 | 9/2006 |
| EP | 11792836 | 12/2013 |
| JP | 2005175457 | 6/2005 |
| JP | 2005-353779 | 12/2005 |
| JP | 2006032729 | 2/2006 |
| JP | 2006040981 | 2/2006 |
| JP | 2006074028 | 3/2006 |
| JP | 2006121044 | 5/2006 |
| JP | 2008-192995 | 8/2008 |
| JP | 2009-081251 | 4/2009 |
| JP | 2009-163867 | 7/2009 |
| JP | 2009-267411 | 11/2009 |
| JP | 2010-009669 | 1/2010 |
| JP | 2010-010688 | 1/2010 |
| JP | 2010-232214 | 10/2010 |
| JP | 2010-263211 | 11/2010 |
| KR | 2005-0008353 | 1/2005 |
| KR | 1020060087882 | 8/2006 |
| KR | 10-0751736 | 8/2007 |
| KR | 20070111840 | 11/2007 |
| KR | 20070118865 | 12/2007 |
| KR | 20090109804 | 10/2009 |
| KR | 20100078808 | 7/2010 |
| KR | 20100083402 | 7/2010 |
| TW | 097147549 | 5/2013 |
| TW | 100119681 | 8/2013 |
| TW | 100135681 | 10/2013 |
| WO | WO 2006/003620 | 1/2006 |
| WO | WO 2008/029446 | 3/2008 |
| WO | 2008/084422 | 3/2009 |
| WO | WO 2009/127187 | 10/2009 |
| WO | WO 2010/068221 | 6/2010 |
| WO | 2008/084422 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | WO 2010-117911 | 10/2010 |
| WO | 2011/035601 | 11/2011 |
| WO | 2011/051785 | 4/2012 |

(56) References Cited

FOREIGN PATENT DOCUMENTS

| WO | 2011/051785 | 5/2012 |
|---|---|---|
| WO | 2012/021168 | 7/2012 |
| WO | 2011/066770 | 9/2012 |
| WO | 2011/035601 | 12/2012 |
| WO | 2011/051785 | 4/2013 |
| WO | 2011/059095 | 6/2013 |
| WO | 2011/066770 | 7/2013 |

OTHER PUBLICATIONS

U.S. Appl. No. 12/099,267, filed Apr. 8, 2008, Smythe et al.
U.S. Appl. No. 12/114,096, filed May 2, 2008, Srinivasan et al.
U.S. Appl. No. 12/141,388, filed Jun. 18, 2008, Liu et al.
U.S. Appl. No. 12/141,559, filed Jun. 18, 2008, Sandhu et al.
U.S. Appl. No. 12/166,604, filed Jul. 2, 2008, Sinha et al.
U.S. Appl. No. 12/701,885, filed Feb. 8, 2010, Sandhu et al.
U.S. Appl. No. 12/765,698, filed Apr. 22, 2010, Sandhu et al.
U.S. Appl. No. 12/765,606, filed Apr. 22, 2010, Tang et al.
U.S. Appl. No. 12/959,015, filed Dec. 2, 2010, Liu.
U.S. Appl. No. 12/979,189, filed Dec. 27, 2010, Sills et al.
U.S. Appl. No. 13/010,048, filed Jan. 20, 2011, Liu et al.
Baek et al., "Multi-Layer cross-oint Binary Oxide resistive memory (OxRRAM) for Post-NAND Storage Application", IEEE, 2005.
Bedeschi et al., "A Bipolar-Selected Phase Change Memory Featuring Multi-Level Cell Storage", IEEE, vol. 44, No. 1, Jan. 2009, pp. 217-227.
Chen e tal., "Non-Volatile Resistive Switching for Advanced Memory Applications", IEEE, 2005, 4 pages.
Chen et al., Peroskite RRAM Devices with Metal/Insulator/PCMO/Metal Heterostructures, 2005; pp. 125-128.
Choi et al., "Defect Structure and Electrical Properties of single-Crystal Ba0.03SR0.97TiO3", J. Am Ceram. Soc., 71, [4], pp. 201-205, 1988.
Courtade et al., "Microstructure and resistance switching in NiO binary oxide films obtained from Ni oxidation", IEEE, 2006, pp. 94-99.
Higaki et al., "Effects of Gas Phase Absorption into Si Substrates on Plasma doping Process" A208; Jan. 2004.
Ho et al., "A Highly Reliable Self-=Aligned Graded Oxide WOx Resistance Memory: Conduction Mechanisms and Reliability", 2007 Symposium on VLSI Technology Digest of Technical Papers, pp. 228-229.
Hosoi et al., "High Speed Unipolar Switching Resistance RAM (RRAM) Technology", Advanced Materials Res. Lab, Japan; Correlated Electron Res. Center (CERC), Japan; Nanotechnology Res. Inst. (NRI), Japan, Dec. 2006; 4 pp.
Hudgens et al., "Overview of Phase-Change Chalcogenide Nonvolatile Memory Technology", MRS Bulletin, Nov. 2004, pp. 829-832.
Ignatiev et al., "Resistance Non-volatile Memory-RRAM", Mater. Res. Soc. Symp. Proc., vol. 997, 2007, Materials Research Society, 9 pages.
Karg et al., "Nanoscale REsistive Memory Device using SrRiO3 Films", IEEE, 2007, pp. 68-70.
Kau et al., "A Stackable cross point phase change memory", IEEE, 2009, pp. 27.1.1-27.1.4.
Komori et al., Disturbless flash memory due to high boost efficiency on BiCS structure and optimal memory film stack for ultra high density storage device; Dec. 2008; pp. 851-854.
Kooij et al., "Photoselective Metal Deposition on Amorphous Silicon p-i-n Solar Cells", Electrochemical Society Letters, Journal of Electrochemical Society vol. 44, No. 10, Oct. 1997, pp. L271-L272.
Kozicki et al., "Non-Volatile Memory Based on Solid Electrolytes", Center for Solid State Electronics Research, Arizona State University, Nov. 2004, 8 pp.
Kozicki, "Memory Devices Based on Solid Electrolytes", Mater, Res. Soc. Symp. Proc., vol. 997, 2007, Materials Research Society, 10 pages.
Lee et al., "2-stack 1D-1R Cross-Point Structure with Oxide Diodes as Switch Elements for High Density Resistance RAM Applications", IEE, 2007, pp. 771-774.
Lee et al., "Resistance Switching of Al doped ZnO for Non-Volatile Memory Applications", Dept. of Materials Science and Engineering, Gwangju Institute of Science and Technology, May 2006; 2 pp.
Lin et al., "Effect of Top Electrode Material on REsistive Switching Properties fo ZrO2 Film Memory Devices", IEEE, May 2007, vol. 28, No. 5, pp. 366-368.
Meyer et al., "Oxide Dual-Layer Memory Element for Scalable Non-Volatile Cross-Point Memory Technology", IEEE, 2008, 5 pages.
Miyashita et al., "A Novel Bit-Line Process using Poly-Si Masked Dual-Damascene (PMDD) for 0.13 um DRAMs and Beyond", IEEE, 2000, pp. 15.4.1-15.4.4.
Muller et al., "Emerging Non-Volatile Memory Technologies", IEEE, 2003, pp. 37-44.
Oh, "Full Integration of Highly Manufacturable 512Mb PRAM based on 90nm Technology" 2006, IEEE, 4 pages.
Pein et al., "Performance of the 3-D Pencil Flash EPROM Cell and Memory Array", IEEE, 1995, pp. 1982-1991.
Pellizzer et al., "A 90nm Phase Change Memory Technology for Stand-Alone Non-Volatile Memory Applications", IEEE, 2006, Symposium on VLSI Technology Digest of Technical Papers, 2 pages.
Pirovano et al., "Self-Aligned u Trench Phase-Change Memory Cell Architecture from 90nm Technology and Beyond", IEEE, 2007, pp. 222-225.
Programmable metallization cell, Dec. 11, 2007; http://en.wikipedia.org/wiki/Programmable_metallization_cell on Dec. 13, 2011.
Scheck et al., "Selective Metal Electrodeposition Through Doping Modulation of Semiconductor Surfaces", Applied Physics Letters 86, 2005, 3 pgs.
Website, http://en.wikipedia.org/wiki/Programmable_metallization_cell; Dec. 11, 2007; Place of Publication is the Internet; 4 pp.
Wuttig, "Towards a Universal Memory?", Nature Materials, vol. 4, Apr. 2005, pp. 265-266.
Xing et al., "Characterization of AlGaN/GaN p-n Diodes with Selectively Regrown n-AlGaN by Metal-Organic Chemical-Vapor Deposition and its Application to GaN-based Bipolar Transistors", Journal of Allpied Physics 97, 2005, 4 pgs.
Yih et al., "SiC/Si Heterojunction Diodes Fabricated by Self-Selective and by Blanket Rapid Thermal Chemical Vapor Deposition", IEEE vol. 41 No. 3, Mar. 1994, pp. 281-287.
Yoon et al., "Vertical Cross-Point Resistance Change Memory for Ultra-High Density Non-volatile Memory Applications", 2009 Symposium on VLSI Technology Digest of Technical Papers, pp. 26-27.
Yu et al., "Structure Effects on Resistive Switching of Al/TiOx/Al Devices for RRAM Applications", IEEE, 2008, pp. 331-333.

\* cited by examiner

US 8,883,604 B2

INTEGRATED CIRCUITRY COMPRISING NONVOLATILE MEMORY CELLS AND METHODS OF FORMING A NONVOLATILE MEMORY CELL

RELATED PATENT DATA

This patent resulted from a divisional application of U.S. patent application Ser. No. 12/909,650, filed Oct. 21, 2010, entitled "Integrated Circuitry Comprising Nonvolatile Memory Cells And Methods Of Forming A Nonvolatile Memory Cell", naming Jun Liu and John K. Zahurak as inventors, the disclosure of which is incorporated by reference.

TECHNICAL FIELD

Embodiments disclosed herein pertain to memory cells of integrated circuitry, and to methods of forming memory cells.

BACKGROUND

Memory is one type of integrated circuitry, and is used in computer systems for storing data. Such is usually fabricated in one or more arrays of individual memory cells. The memory cells might be volatile, semivolatile, or nonvolatile. Nonvolatile memory cells can store data for extended periods of time, in many instances including when the computer is turned off. Volatile memory dissipates and therefore requires to be refreshed/rewritten, in many instances multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two current conductive electrodes having a programmable material received there-between. The programmable material is selected or designed to be configured in a selected one of at least two different resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

One example memory device is a programmable metallization cell (PMC). Such may be alternatively referred to as conductive bridging RAM (CBRAM), nanobridge memory, or electrolyte memory. A PMC uses ion conductive material (for instance, a suitable chalcogenide or any of various suitable oxides) sandwiched between a pair of electrodes. A suitable voltage applied across the electrodes generates current conductive super-ionic clusters or filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across electrodes essentially reverses the process and thus removes the current conductive paths. A PMC thus comprises a high resistance state (corresponding to the state lacking a current conductive filament or clusters between the electrodes) and a low resistance state (corresponding to the state having a current conductive filament or clusters between the electrodes), with such states being reversibly interchangeable with one another.

DETAILED DESCRIPTION OF EXAMPLE EMBODIMENTS

Figure 1:
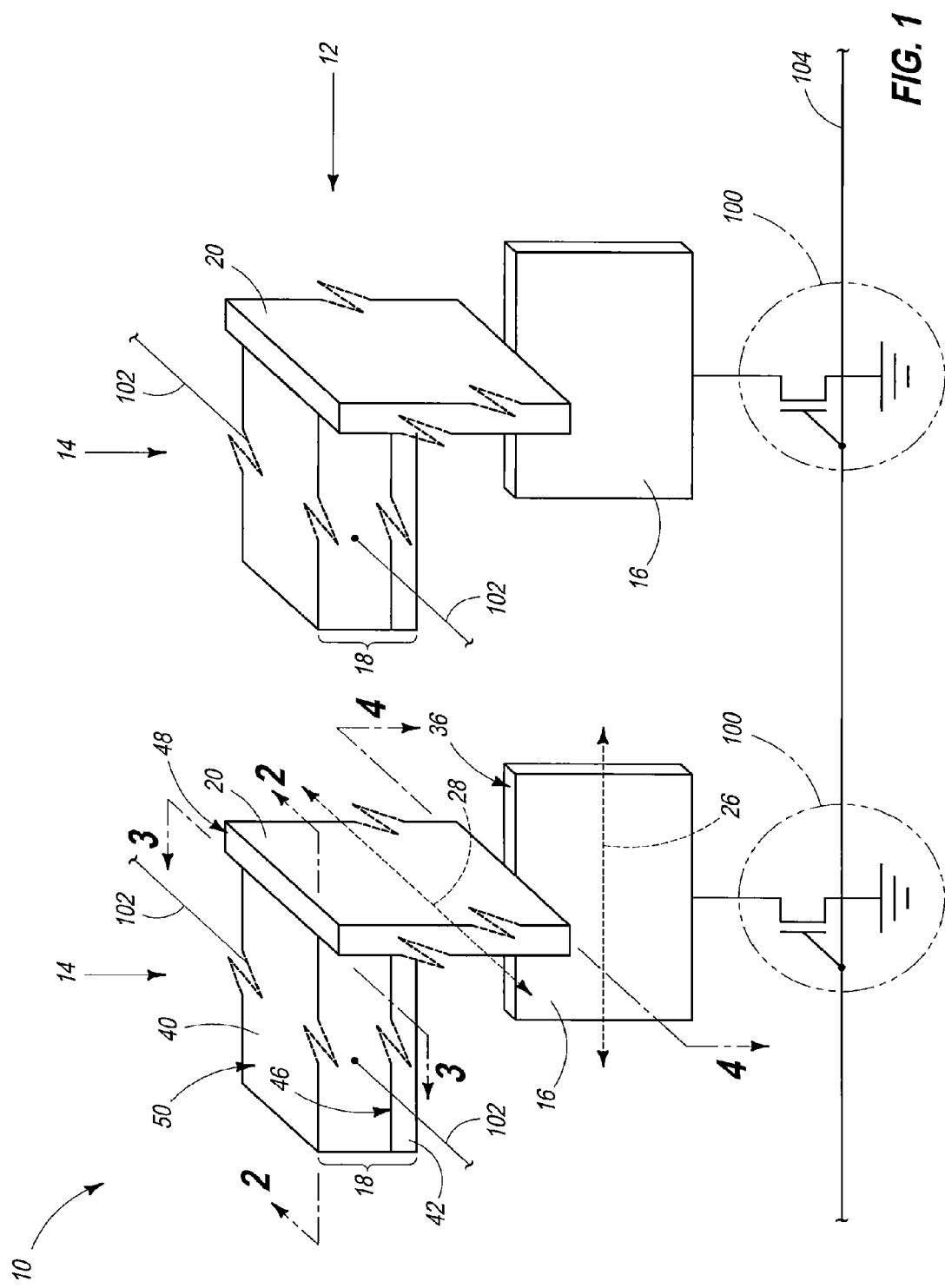
FIG. 1 is a hybrid schematic and fragmentary structural view of a portion of an integrated circuit in accordance with an embodiment of the invention.

Embodiments of the invention encompass integrated circuitry comprising a nonvolatile memory cell, and methods of forming a nonvolatile memory cell. Referring initially to FIGS. 1-4, an example integrated circuit 10 comprises a plurality of nonvolatile memory cells 14 formed within a memory array 12. An individual memory cell 14 comprises a first current conductive electrode 16, a second current conductive electrode 18 formed elevationally outward thereof, and an ion conductive material 20 received between such electrodes. A material 22, which may be homogenous or non-homogenous, may surround components 16, 18 and 20. Material 22 is not shown in FIG. 1 for clarity in depicting the operable components. Material 22 would likely be insulative at least where contacting components 16, 18, and 20 in the figures, with doped silicon dioxide being an example.

Components 16, 18, 20 and material 22 may be fabricated relative to or supported by a suitable base substrate (not shown), for example a semiconductor substrate which may comprise monocrystalline silicon and/or other semiconductive material. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Electrodes 16 and 18 may comprise any suitable current conductive material, and may be homogenous or non-homogenous. In the context of this document, "current conductive material" is a composition where electric current flow would inherently occur therein predominantly by movement of sub-atomic positive and/or negative charges when such are generated as opposed to predominantly by movement of ions. At least one of first electrode 16 and second electrode 18 has an electrochemically active surface received directly against ion conductive material 20. In this document, a material or structure is "directly against" another when there is at least some physical touching contact of the stated materials or structures relative one another. In contrast, "over" encompasses "directly against" as well as constructions where intervening material(s) or structure(s) result in no physical touching contact of the stated materials or structures relative one another. By way of examples only, suitable current conductive and electrochemically active materials include copper, silver, and alloys including at least one of copper and silver. Example suitable current conductive and electrochemically inactive materials include titanium nitride, gold, tungsten, platinum, and alloys including at least one of gold, tungsten or platinum.

Ion conductive material 20 may be a solid, gel, or any other suitable phase, and may be homogenous or non-homogenous. Example suitable materials comprise chalcogenide-type (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and $CuTe$) and/or oxides such as zirconium oxide, hafnium oxide, tungsten oxide, silicon oxide (specifically, silicon dioxide), gadolinium oxide, etc. Such may have silver ions or other suitable ions diffused therein for ionic conduction, analogously to structures disclosed in U.S. Pat. No. 7,405,967 and U.S. Patent Publication Number 2010/0193758.

In one embodiment, second electrode 18 may be considered as having a lateral outermost sidewall 21 (FIGS. 2 and 3) and ion conductive material 20 may be considered as having a transverse outermost sidewall 24 (FIG. 2) received directly against such second electrode sidewall 21. In one embodiment, such may be vertically oriented at least where each is directly received against the other. In this document, vertical is a direction generally orthogonal to a primary surface relative to which the substrate is processed during fabrication and which may be considered to define a generally horizontal direction. Further, "vertical" and "horizontal" as used herein are general perpendicular directions relative one another independent of orientation of the substrate in three dimensional space. Further in this document, "elevationally outward" is with reference to the vertical direction from a base substrate upon which the circuitry is fabricated.

In one embodiment, first electrode 16 may extend laterally in a first direction 26 and ion conductive material 20 may extend laterally in a second direction 28 different from and intersecting first direction 26. Accordingly, such angle relative to one another, with reference to "angle" herein meaning any angle other than the straight angle. In one embodiment, first and second directions 26, 28 intersect at an angle from about 45° to 90°, and in one embodiment from 80° to 90°. Such are shown in FIGS. 1-4 as intersecting at a 90° angle 29 (FIG. 4), as an example. First direction 26 and direction 28 may be parallel to the horizontal direction.

Figure 4:
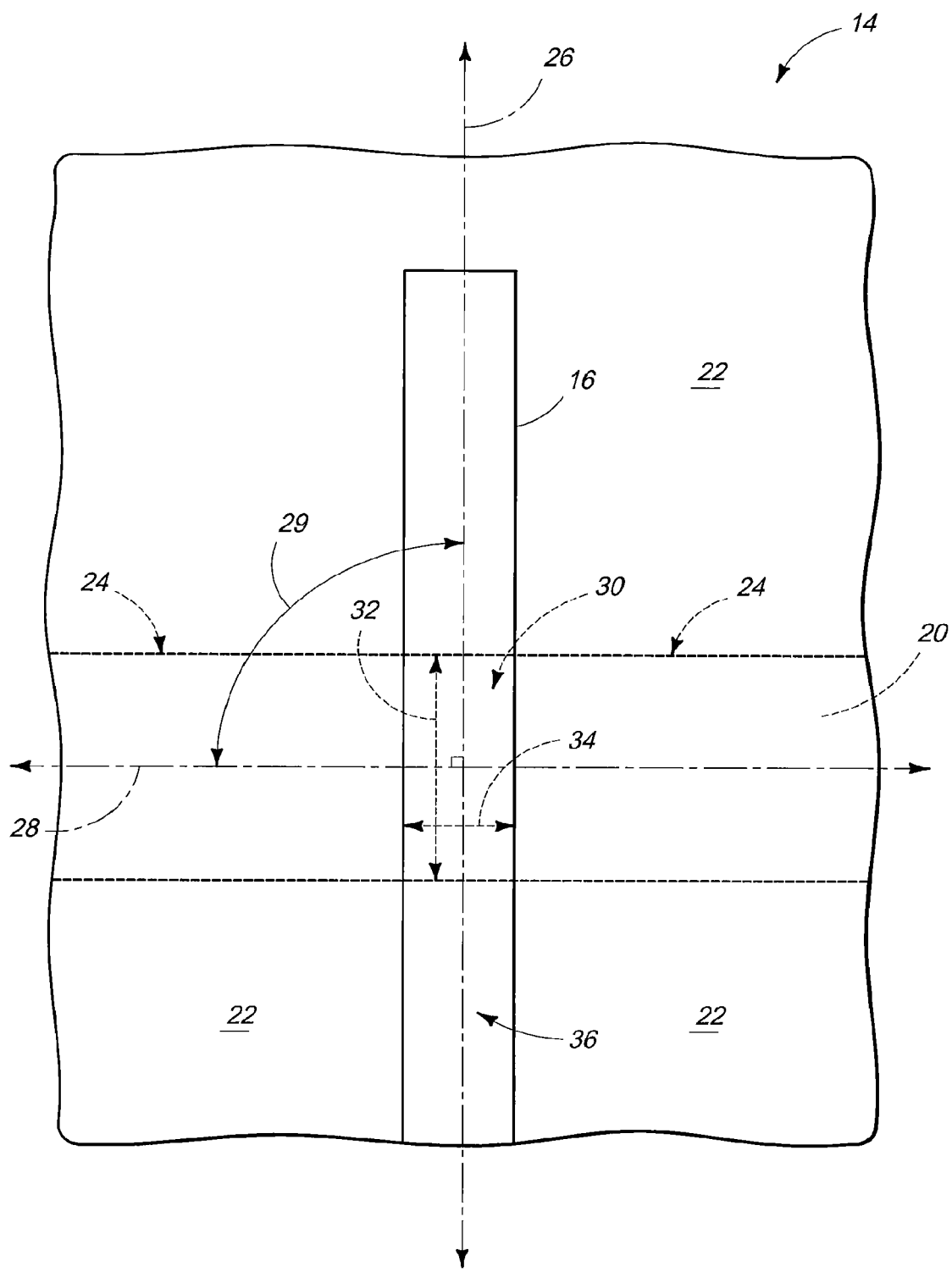
FIG. 4 is a sectional view of a portion of FIG. 1 taken through line 4-4 in FIG. 1.

Regardless and referring to FIG. 4, in one embodiment ion conductive material 20 and first electrode 16 may be considered as contacting one another at a maximum contacting area 30. Such is defined by a transverse thickness 32 of ion conductive material 20 and a transverse thickness 34 of first electrode 16 where such cross at angle 29 of intersecting directions 26 and 28. Such may provide an advantage of more precisely defining a position from where a conduction channel through material 20 will initiate upon programming to a low resistance state. Such may also provide an advantage of assuring formation of only a single conduction channel, where such is desired. In one embodiment, at least one of first electrode 16 and ion conductive material 20 has its respective transverse thickness where such cross which is less than F, where F is a minimum feature dimension of lithographically-defined features of the substrate (meaning the minimum of all feature dimensions which are defined lithographically). Regardless, an example thickness range 32 for ion conductive material 20 is from about 2 to 30 nanometers, while that for first electrode 16 is from about 2 to 20 nanometers (thickness 34). In one embodiment, each of the first electrode 16 and ion conductive material 20 has a respective uniform transverse thickness which may be the same or different from each other, with different thicknesses being shown.

First electrode 16 may be considered as having an elevationally outer surface 36 with, in one embodiment, at least a portion thereof being received directly against ion conductive material 20. Analogously, second electrode sidewall 21 may be considered as comprising a surface received directly against ion conductive material 20. At least a portion of at least one of sidewall 21 or surface 36 as received directly against ion conductive material 20 is electrochemically active. Accordingly, second electrode 18 and/or first electrode 16 has some electrochemically active surface received directly against ion conductive material 20.

In one embodiment, at least second electrode 18 comprises an electrochemically active surface. By way of example, second electrode 18 is shown as comprising a composite of current conductive material 40 and current conductive material 42, with material 42 in one embodiment also constituting an electrochemically active material having a surface 21 which is received directly against ion conductive material 20. Material 40 and material 42 may, respectively, be homogenous or non-homogenous. An example thickness range for current conductive and electrochemically active material 42 is from about 2 to 30 nanometers, while that for current conductive material 40 is from about 10 to 80 nanometers. Current conductive material 40 may or may not also be electrochemically active, and in one embodiment is electrochemically inactive, for example comprising elemental tungsten. In one embodiment, the current conductive material of first electrode 16 may be electrochemically inactive, again with elemental tungsten being one specific example.

Within array 12, material 42 and/or material 40 may extend/run continuously in individual of the column/row lines, or first electrode 16 may run continuously in individual of the column/row lines. Regardless, ion conductive material 20 may extend/run continuously in a line, may be continuous throughout the array, or may be patterned with defined edges for individual of the memory cells. As an example only, FIGS. 1-4 show material 40 and ion conductive material 20 extending along or as respective continuous lines, with material 42 and first electrode 16 being isolated structures for each memory cell 14.

In one embodiment where at least the second electrode comprises an electrochemically active material having a surface directly against ion conductive material, the ion conductive material has an elevationally outermost surface which is elevationally outward of an elevationally outermost surface of the electrochemically active material. For example in the embodiment of FIGS. 1-4, electrochemically active material 42 may be considered as having an elevationally outermost surface 46 and ion conductive material 20 may be considered as having an elevationally outermost surface 48. Surface 48 is elevationally outward of surface 46. In one embodiment, the second electrode may comprise an electrochemically inactive material which is received elevationally outward of the electrochemically active material of the second electrode. The electrochemically inactive material comprises an elevationally outermost surface which is elevationally coincident with the elevationally outermost surface of the ion conductive material. For example in the embodiment of FIGS. 1-4 where material 42 is electrochemically active and material 40 is electrochemically inactive, material 40 comprises an elevationally outermost surface 50 which is elevationally coincident with surface 48 of ion conductive material 20.

Figure 5:
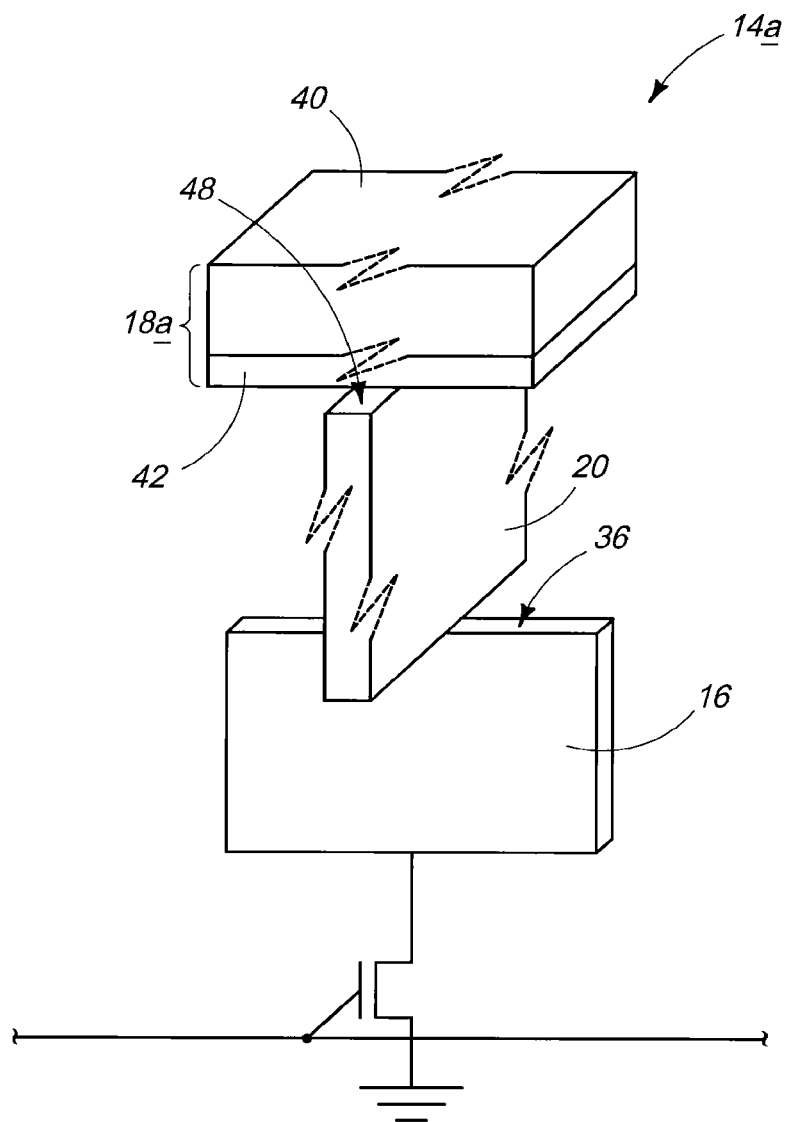
FIG. 5 is a hybrid schematic and fragmentary structural view of a portion of an alternate embodiment integrated circuit in accordance with an aspect of the invention.

In one embodiment, each of the first electrode, the second electrode, and the ion conductive material is platelike and oriented perpendicularly relative each other. In the context of this document, "platelike" defines a construction having length and width dimensions which are each at least 2.5 times greater than a maximum transverse thickness/depth of the construction orthogonal to the length and width. FIG. 1 depicts such a construction where each of electrodes 16, 18 and ion conductive material 20 is platelike (having edge surfaces) and perpendicularly oriented relative to each other. Any other attribute may apply as described above. By way of example, the second platelike electrode may comprise an electrochemically active surface received directly against the platelike ion conductive material. Further as an example, the platelike ion conductive material may comprise an elevationally outermost surface having the second electrode received directly there-against, for example as shown in the embodiment of FIG. 5. The electrodes and ion conductive material of the embodiments of FIGS. 1 and 5 may be considered respectively as being platelike in a volume expanse encompassing an individual memory cell 14/14a even if one or more of such extends or runs continuously in an individual line or is otherwise continuous in some aspect other than shown.

Figure 2:
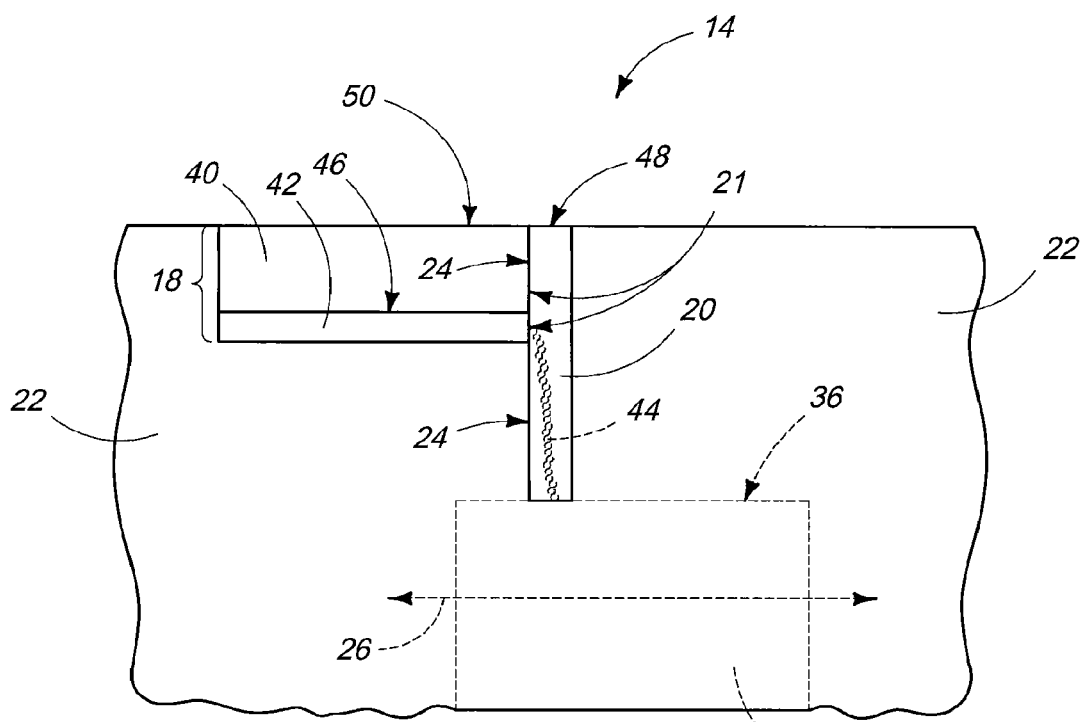
FIG. 2 is a sectional view of a portion of FIG. 1 taken through line 2-2 in FIG. 1.
Figure 3:
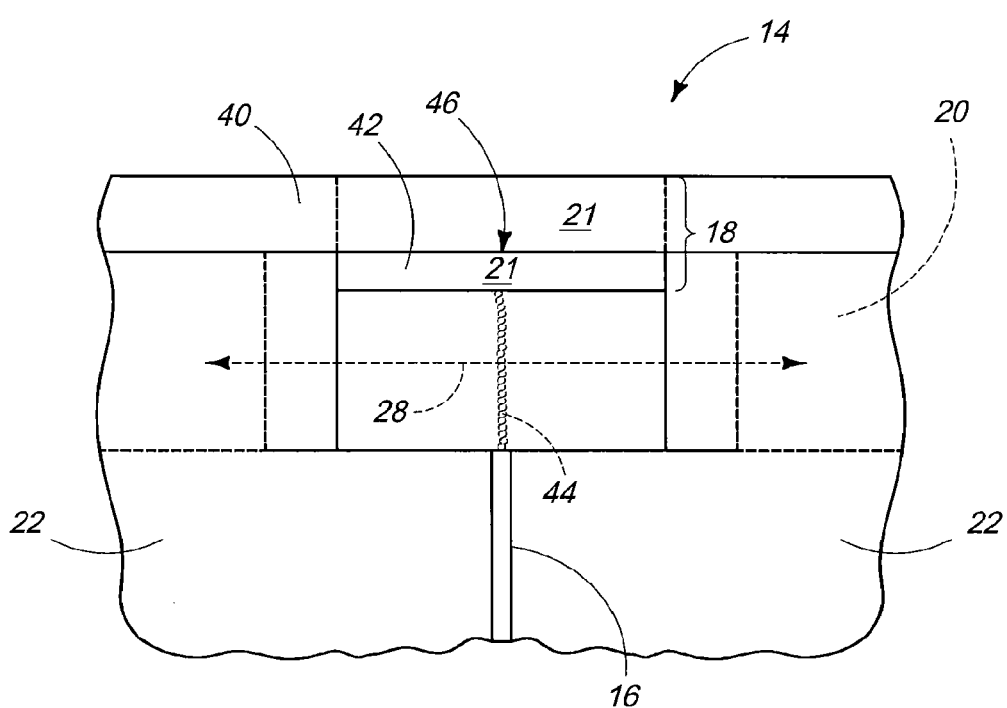
FIG. 3 is a sectional view of a portion of FIG. 1 taken through line 3-3 in FIG. 1.

FIGS. 2 and 3 diagrammatically depict memory cell 14 as being programmed in an example low resistance "1" state wherein a low electrical resistance/current conduction path 44 has been formed through ion conductive material 20. Conduction path 44 extends from and between surface 36 of first electrode 16 and sidewall 21 of current conductive material 42 where such are each received directly against ion conductive material 20. Conduction path 44 may be in the form of a path of current conductive particles which may or may not be directly against one another, with single ions and super-ionic clusters being examples. In some embodiments, the conduction path may be a filament, for example as described in U.S. Patent Publication No. 2010/01100759. Conduction path 44 may be formed by application of a suitable electric field through ion conductive material 20 to cause ions from the electrochemically active surface of one electrode to pass towards the opposing electrode and grow conduction path 44 through ion conductive material 20 from such opposing electrode. Such may be achieved by providing a suitable voltage differential to electrodes 16 and 18. Memory cell 14 may be programmed to an example high resistance "0" state by at least reversing polarity of the voltage differential to reverse the process, thereby removing conduction path 44. Memory cell 14 may thereby be repeatedly programmable between at least two programmed states by application of suitable voltage differentials to move between programmed states.

FIG. 1 depicts but one example architecture for array 12 of integrated circuit 10. In such, memory cell 14 is connected between or as portions of a schematically illustrated field effect transistor 100 and a schematically illustrated data/sense line 102 (i.e., a bit line). First electrode 16 is connected with or comprises one source/drain region of transistor 100, with the other source/drain region thereof connected to a suitable potential depicted as ground in FIG. 1, as an example. The gate of field effect transistor 100 may comprise a control line 104 (i.e., a word line) of a row line or column line of memory cells 14. Bit line 102 may comprise a corresponding other of a row line or column line of memory cells 14.

Some or all of second electrodes 18 in an individual data/sense line 102 may extend continuously along such data/sense line. As an example alternate embodiment, the architecture may be reversed. For example, some or all of first electrodes 16 may extend continuously along an individual control line, and individual second electrodes 18 may be isolated constructions relative one another along a corresponding data/sense line. Further and regardless, the roles of data/sense and control lines may be reversed.

An alternate embodiment nonvolatile memory cell 14a is shown in FIG. 5 in comparison to a single memory cell 14 in FIG. 1. Like numerals from the above-described memory cell 14 are used where appropriate, with some construction differences being indicated with the suffix "a". In memory cell 14a, second electrode 18a is received directly against elevationally outermost surface 48 of ion conductive material 20. Any other attribute as described above may apply to the nonvolatile memory cell construction 14a of FIG. 5. As an alternate example, in one embodiment, second electrode 18/18a might be oriented edgewise (not shown) such that it is oriented like first electrode 16, for example any of directly over and parallel thereto, not directly over and parallel thereto, and directly over or not directly over yet angled relative to first electrode 16.

Embodiments of the invention encompass methods of forming a nonvolatile memory cell. Example such methods are described with reference to FIGS. 6-10 with respect to a substrate fragment 60 in fabrication of a nonvolatile memory cell of the FIGS. 1-4 embodiments. The artisan will appreciate that the FIG. 5 or other nonvolatile memory cells may also or alternately be fabricated. Further and regardless, the fabrication methods disclosed herein are not necessarily limited by the structural aspects described above, nor are any structural aspects described above necessarily limited by methods of fabrication, unless so claimed.

Figure 6:
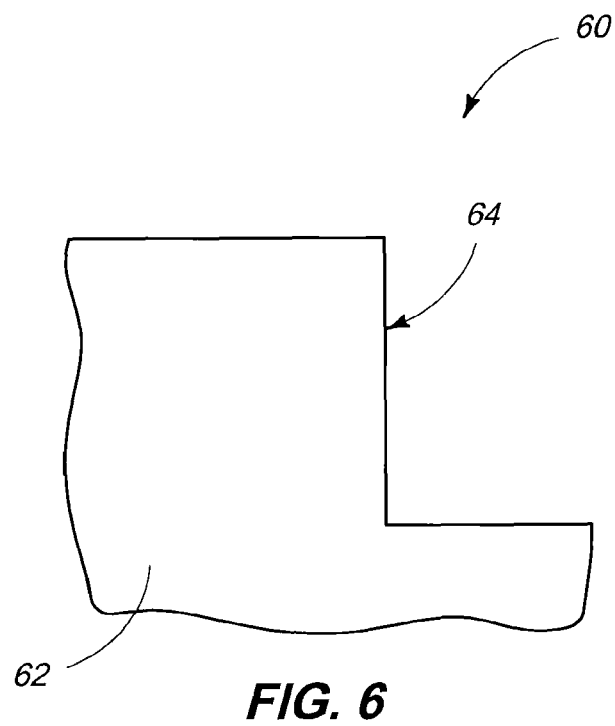
FIG. 6 is a diagrammatic sectional view of a substrate fragment in process in accordance with an embodiment of the invention.

Referring to FIG. 6, substrate 60 may comprise a semiconductor substrate, and is shown as comprising a material 62 having a first sidewall 64. Material 62 may be of any composition, may be homogenous or non-homogenous, and sidewall 64 may be vertically oriented. An example material 62 is some portion of material 22 of the above-described embodiments.

Figure 7:
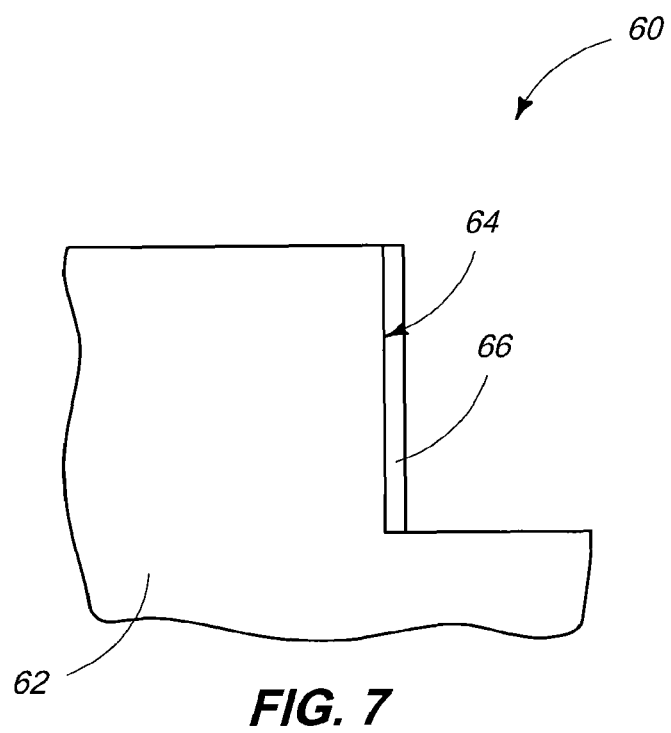
FIG. 7 is a view of the FIG. 6 substrate at a processing step subsequent to that shown by FIG. 6.

Referring to FIG. 7, a first current conductive electrode material 66 has been formed over first sidewall 64. In one embodiment, material 66 is formed to have a transverse thickness (thickness orthogonal to sidewall 64) which is less than F. An example technique for forming material 66 is by any suitable conformal deposition of material 66 over material 62, followed by anisotropic etching thereof to clear material 66 from the outer surfaces of material 62. Such may be conducted with or without masking. Regardless, alternate or additional techniques may be used. First current conductive electrode material 66 may have any of the attributes, including but not limited to "shape", of first electrode 16 described above. Accordingly, first current conductive electrode material 66 may be first electrode 16 of the FIGS. 1-4 embodiment.

Figure 8:
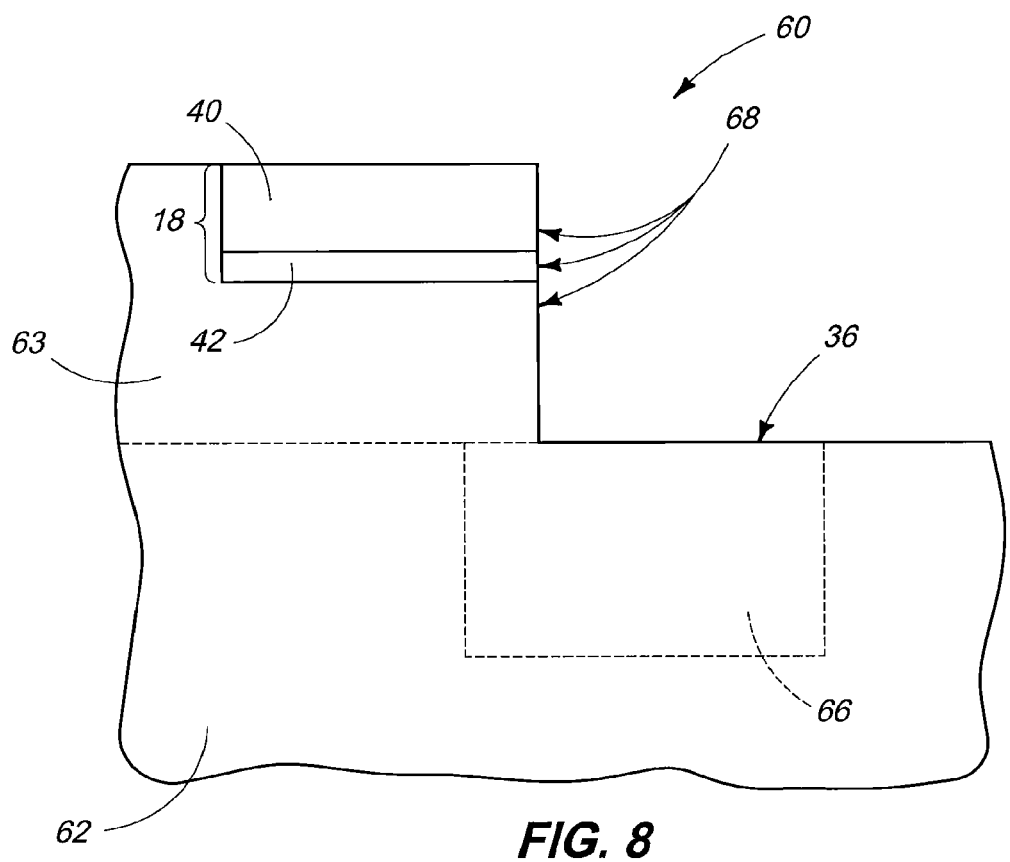
FIG. 8 is a view of the FIG. 7 substrate, at 90° to the FIG. 7 cross section, at a processing step subsequent to that shown by FIG. 7.
Figure 9:
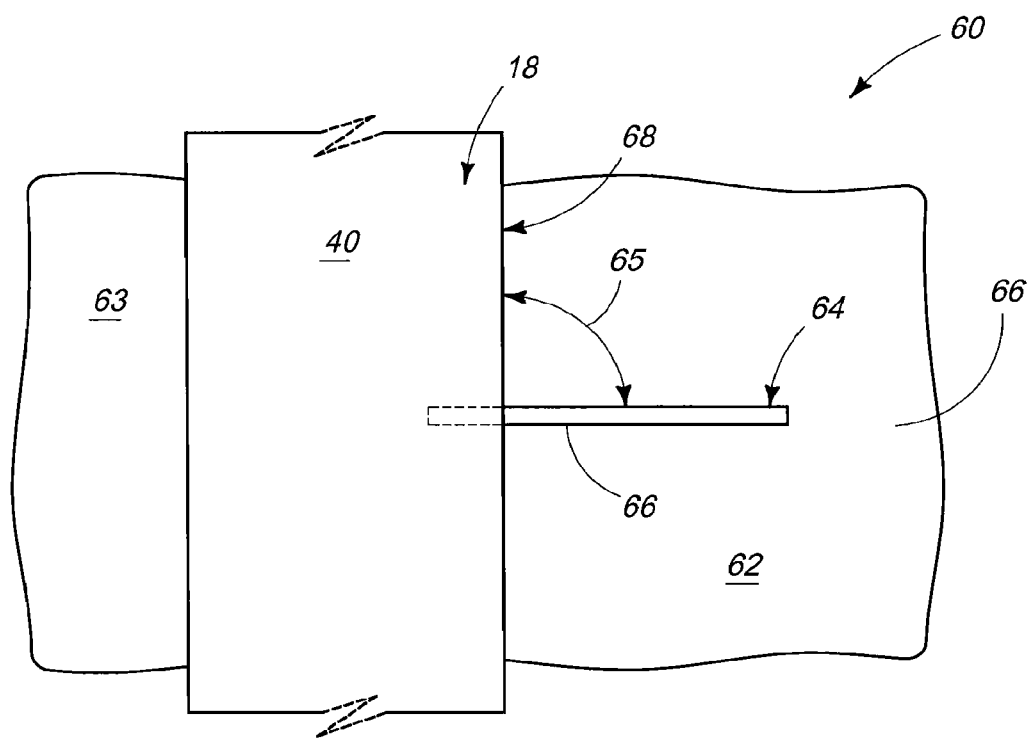
FIG. 9 is a diagrammatic top-down view of the FIG. 8 substrate.

Referring to FIGS. 8 and 9, a second sidewall 68 has been formed elevationally outward of first current conductive material 66, and first and second sidewalls 64, 68 have been formed at an angle 65 relative one another. In one embodiment, such angle is from about 45° to 90°, in one embodiment from 80° to 90°, and with an angle of 90° being shown. Sidewall 68 may be vertically oriented. In the embodiment of FIGS. 8 and 9, a material 63 has been formed over material 62 and first current conductive electrode material 66 and second current conductive electrode 18 have been provided relative thereto. Material 63 may be of the same composition as material 62. Materials 62 and 63 might be considered as a composite of material 22 of the embodiments of FIGS. 1-4.

Figure 10:
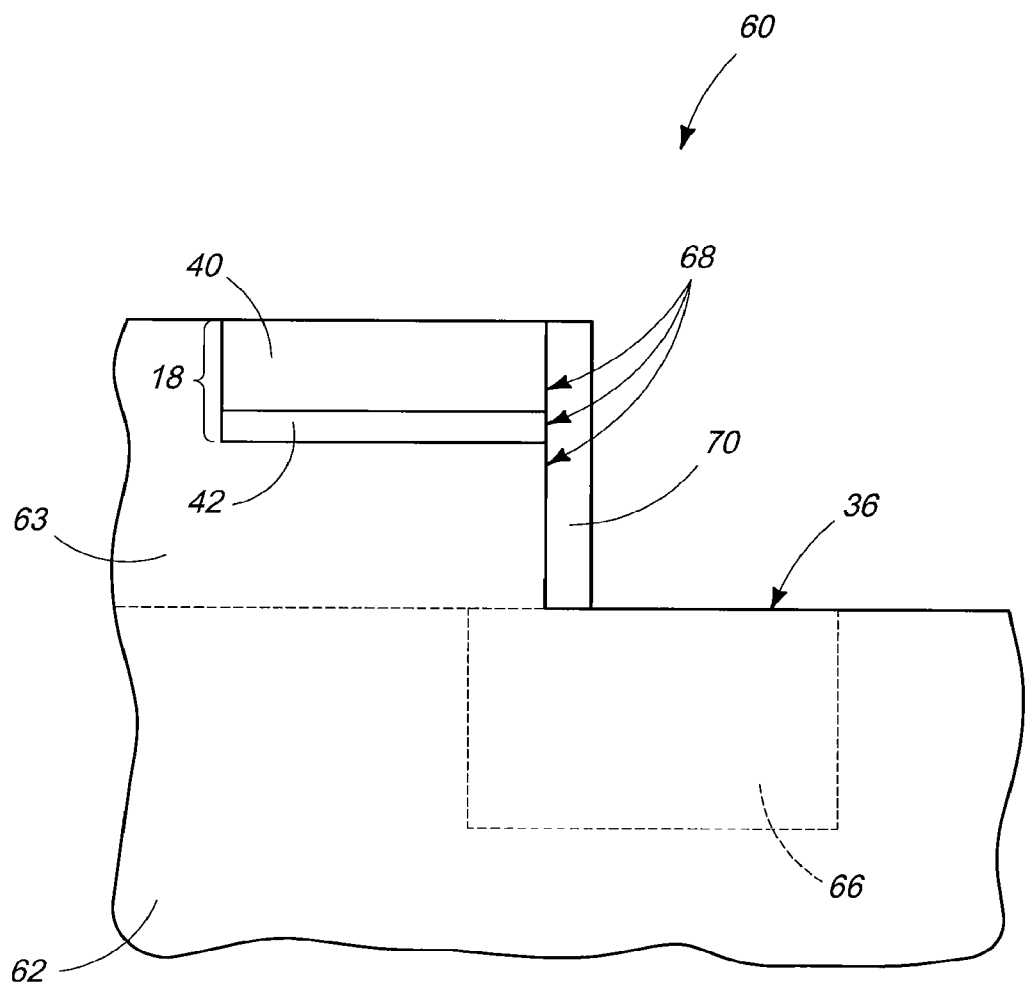
FIG. 10 is a view of the FIG. 8 substrate at a processing step subsequent to that shown by FIG. 8.

Referring to FIG. 10, an ion conductive material 70 has been formed over second sidewall 68 and directly against an elevationally outer surface 36 of first current conductive material 66. Example materials and attributes are as described above with respect to ion conductive material 20. Accordingly, ion conductive material 70 may be ion conductive material 20 in the first described embodiments. An example technique for forming ion conductive material 70 is by any suitable conformal deposition of material 70 over materials 40, 63, and 62, followed by anisotropic etching thereof to clear material 70 from the outer surfaces of materials 40, 63, and 62. Ion conductive material 70 and first current conductive material 66 contact one another at a maximum contacting area defined by a transverse thickness of the ion conductive material and a transverse thickness of the first current conductive electrode where such cross at their angle of intersection, for example analogous to and as depicted and described above with respect to FIG. 4.

Regardless, a second current conductive electrode is provided directly against the ion conductive material, with at least one of the first current conductive electrode and the second current conductive electrode having an electrochemically active surface directly against the ion conductive material. The second electrode may have any of the attributes as described above. Further, the ion conductive material may be formed before or after forming the second current conductive electrode. The FIGS. 6-10 embodiment is an example wherein the ion conductive material is formed after forming the second current conductive electrode. Alternately by way of example, FIG. 5 depicts an embodiment more conducive to forming the ion conductive material before forming the second current conductive electrode.

An embodiment of the invention includes a method of forming a nonvolatile memory cell comprising forming first and second electrodes where at least one of such has an electrochemically active surface, and independent of any other attribute described above (although such are example attributes which may be used in this embodiment). For example, such formation of first and second electrodes in accordance with this embodiment is independent of elevational or other orientation of the electrodes relative to each other. Regardless, after forming the first and second electrodes, an ion conductive material is deposited directly against the electrochemically active surface. Heretofore, the prior art is not understood to anywhere deposit an ion conductive material directly against an electrochemically active surface of a first and/or second electrode after both such electrodes have been formed.

In one embodiment, a dielectric may be provided between the first and second electrodes, and have a lateral sidewall. The ion conductive material may also be deposited directly against the dielectric lateral sidewall. For example with respect to FIG. 8 where material 63 comprises a dielectric, a portion of sidewall 68 (i.e., that which is below material 42) is a dielectric lateral sidewall directly against which ion conductive material 70 is deposited, for example as shown in FIG. 10. Any other attribute may be used as described above.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a nonvolatile memory cell, comprising:

forming support material having an elevationally outer surface, a first sidewall joined and angling relative to the elevationally outer surface, and an elevationally inner surface joined and angling relative to the first sidewall;

forming a first current conductive electrode material elevationally over the elevationally outer surface, laterally of and laterally over the first sidewall, and directly against the elevationally inner surface;

removing the first current conductive material from being elevationally over the elevationally outer surface and from being directly against most of the elevationally inner surface to form a first platelike electrode having one sidewall against the first sidewall and another sidewall opposite the one sidewall that is laterally outwardly exposed;

forming a second sidewall elevationally outward of the first platelike electrode, the first and second sidewalls being formed at an angle relative one another;

forming an ion conductive material over the second sidewall and directly against an elevationally outer surface of the first platelike electrode, the ion conductive material and the first current conductive electrode material of the first platelike electrode contacting one another at a maximum contacting area defined by a transverse thickness of the ion conductive material and a transverse thickness of the first current conductive electrode material where such cross at said angle; and providing a second current conductive electrode material directly against the ion conductive material, at least one of the first current conductive electrode material and the second current conductive electrode material having an electrochemically active surface directly against the ion conductive material.

2. The method of claim 1 wherein the angle is from about 45° to 90°.

3. The method of claim 2 wherein the angle is from 80° to 90°.

4. The method of claim 1 wherein the first sidewall is vertically oriented.

5. The method of claim 1 wherein the second sidewall is vertically oriented.

6. The method of claim 1 wherein the first and second sidewalls are vertically oriented.

7. The method of claim 1 comprising forming the ion conductive material after forming the second current conductive electrode material.

8. The method of claim 1 comprising forming the ion conductive material before forming the second current conductive electrode material.

9. The method of claim 1 comprising providing a transverse sidewall of the ion conductive material directly against a lateral sidewall of the second electrode material.

10. The method of claim 1 comprising forming the ion conductive material to a transverse thickness where such cross which is less than F, where F is a minimum feature dimension of lithographically-defined features.

11. The method of claim 1 comprising forming the first current conductive electrode material to a transverse thickness where such cross which is less than F, where F is a minimum feature dimension of lithographically-defined features.

12. The method of claim 1 comprising forming the first current conductive electrode material and the ion conductive material to respective transverse thicknesses where such cross which are less than F, where F is a minimum feature dimension of lithographically-defined features.

13. The method of claim 1 wherein the first sidewall is dielectric.

14. The method of claim 1 wherein the removing comprises anisotropic etching of the first current conductive material.

15. The method of claim 14 wherein the anisotropic etching is conducted maskless.

16. The method of claim 1 wherein the angle of the first and second sidewalls relative one another is not 90°.

17. The method of claim 16 wherein the angle of the first and second sidewalls relative one another is from 45° to 80°.

* * * * *